US012584884B2

(12) United States Patent
Sun et al.

(10) Patent No.: US 12,584,884 B2
(45) Date of Patent: Mar. 24, 2026

(54) PERFORMANCE TESTING AND EVALUATION METHOD FOR PERMALLOY MATERIAL FOR CONSTRUCTION OF MAGNETICALLY-SHIELDED ROOM

(71) Applicant: Harbin Institute of Technology, Harbin (CN)

(72) Inventors: Zhiyin Sun, Harbin (CN); Yunzhao Li, Harbin (CN); Liyi Li, Harbin (CN); Pengxuan Li, Harbin (CN); Ziqi Li, Harbin (CN); Xiaoyuan Zhang, Harbin (CN)

(73) Assignee: Harbin Institute of Technology, Harbin (CN)

( * ) Notice: Subject to any disclaimer, the term of this patent is extended or adjusted under 35 U.S.C. 154(b) by 0 days.

(21) Appl. No.: 19/021,574

(22) Filed: Jan. 15, 2025

(65) Prior Publication Data

US 2025/0354959 A1     Nov. 20, 2025

(30) Foreign Application Priority Data

Apr. 18, 2024     (CN) .......................... 202410468484.6

(51) Int. Cl.
*G01R 31/00*          (2006.01)
*G01N 27/72*          (2006.01)

(52) U.S. Cl.
CPC ............. *G01N 27/72* (2013.01); *G01R 31/00* (2013.01); *G01R 31/001* (2013.01)

(58) Field of Classification Search
CPC ............................... G01R 31/001; G01N 27/72
See application file for complete search history.

(56) References Cited

U.S. PATENT DOCUMENTS

2018/0284310 A1* 10/2018 Kawano ............... G01R 33/063
2022/0007556 A1*  1/2022 Miyano ............... H01F 1/14708
2024/0345137 A1* 10/2024 Raap .................. G01R 19/0092

FOREIGN PATENT DOCUMENTS

JP          11230944 A      8/1999
JP          2001272378 A   10/2001
(Continued)

OTHER PUBLICATIONS

Shi et al. "An Optimized Measurement Method for Magnetic Properties of Permalloy Sheet Under Demagnetization" Jun. 2022 (Year: 2022).*
(Continued)

*Primary Examiner* — Eyob Hagos

(57)          ABSTRACT

There is provided a performance testing and evaluation method for a permalloy material for construction of a magnetically-shielded room and relates to testing and evaluation on alloy shielding performance. The present disclosure aims to solve the problem of failure to satisfy the requirements of different application scenarios for the magnetic field shielding due to lack of in-depth research on the shielding effect of the current permalloy in the magnetically-shielded rooms. The method includes: at step 1, selecting a permalloy sample, and conducting quality inspection on the sample to ensure the sample is compliance with an experiment requirement; at step 2, setting up an experimental apparatus; where the permalloy sample is vertically placed, and a magnetic field generation coil and a magnetic field measuring sensor are respectively placed at left and right sides of the permalloy sample; at step 3, carrying out shielding performance testing and evaluation on the permalloy sample.

1 Claim, 1 Drawing Sheet

(56) References Cited

FOREIGN PATENT DOCUMENTS

JP       2009229325  A  *  10/2009
JP       2011203264  A  *  10/2011

OTHER PUBLICATIONS

Xu et al. "A Study of Enclosed Magnetic Shielding Room by Simulation", Sep. 2021 (Year: 2021).*
Xiangyu Niu et al. "Research Progress of Electromagnetic Shielding Materials", Journal of Textile Science and Engineering, Apr. 30, 2023.

* cited by examiner

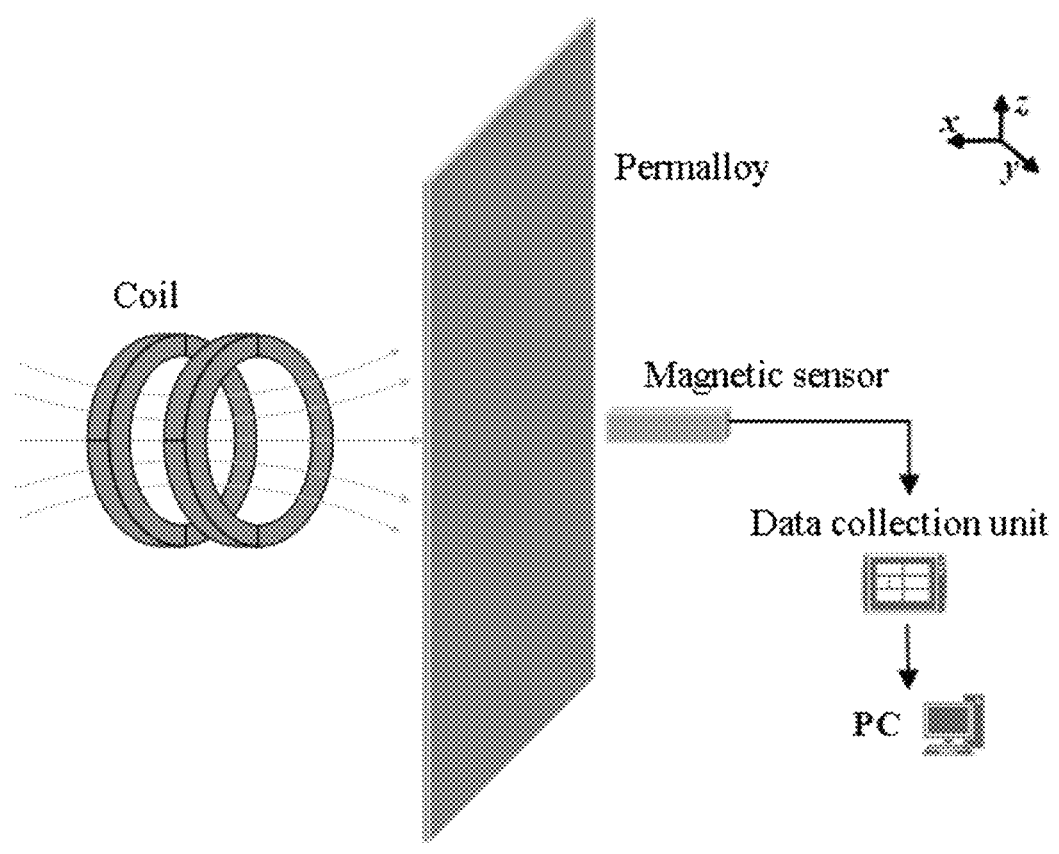

PERFORMANCE TESTING AND EVALUATION METHOD FOR PERMALLOY MATERIAL FOR CONSTRUCTION OF MAGNETICALLY-SHIELDED ROOM

CROSS-REFERENCE TO RELATED APPLICATION

This application claims priority from the Chinese patent application 2024104684846 filed Apr. 18, 2025, the content of which is incorporated herein in the entirety by reference.

TECHNICAL FIELD

The present disclosure relates to the testing and evaluation methods of shielding performance and in particular to a performance testing and evaluation method for a permalloy material for construction of a magnetically-shielded room for performance testing and evaluation in a construction process of a magnetically-shielded room.

BACKGROUND

The permalloy is an alloy material mainly composed of Ni and Fe and has been widely applied in electromagnetism field due to high permeability and good conductivity. Especially in the construction of magnetically-shielded apparatuses, the permalloy, as an excellent shielding material, can effectively weaken the interference of external magnetic fields for internal devices, ensuring normal operation of the equipment and experiments.

The magnetically-shielded room is a key facility for protecting internal devices from interference of external magnetic fields and plays an important role in the fields such as scientific experiments, medical equipment and electronic manufacturing and the like. But in the construction of a traditional magnetically-shielded room, a heavy and expensive ferromagnetic material is usually required, which not only increases the construction costs but also limits its application in some special environments.

Compared with the traditional ferromagnetic material, the permalloy has lighter weight, better permeability and wider frequency response range and thus has a huge potential in the magnetic shielding field. However, the shielding effect of the current permalloy in the shielded rooms is still under research and evaluation and therefore it is required to establish an effective testing method to accurately evaluate its shielding performance.

In conclusion, there is a lack of in-depth research on the shielding effect of the current permalloy in the magnetically-shielded rooms, leading to failure to satisfy the requirements of different application scenarios for the magnetic field shielding.

SUMMARY

In order to solve the problem of failure to satisfy the requirements of different application scenarios for the magnetic field shielding due to lack of in-depth research on the shielding effect of the current permalloy in the magnetically-shielded rooms, the present disclosure provides a performance testing and evaluation method for a permalloy material for construction of a magnetically-shielded room.

The present disclosure provides the following technical solution: a performance testing and evaluation method for a permalloy material for construction of a magnetically-shielded room, which includes:

at step 1, selecting a permalloy sample, and conducting quality inspection on the sample to ensure the sample is compliance with an experiment requirement;

at step 2, setting up an experimental apparatus;

where the permalloy sample is vertically placed, and a magnetic field generation coil and a magnetic field measuring sensor are respectively placed at left and right sides of the permalloy sample;

at step 3, carrying out shielding performance testing and evaluation on the permalloy sample;

at step 31, by adjusting a current of the magnetic field generation coil, generating magnetic fields with different strengths and frequencies, and by using the magnetic field sensor, performing real-time monitoring on a size of the magnetic field shielded by permalloy plates and recording corresponding data;

at step 32, performing Fast Fourier analysis on data collected by the magnetic field sensor to obtain a valid value of the magnetic field corresponding to the applied frequency, namely, the $B_0$ and Bs in the following formula; evaluating the shielding effect of the permalloy under different frequencies and strengths, with the shielding effect calculation formula shown in the Formula (5):

$$SF_B = \frac{|B_0(r)|}{|B_s(r)|} \tag{5}$$

where $B_0$ represents a magnetic field value at the position of the magnetic field sensor with the shielding of the permalloy plates under a same current;

Bs represents a magnetic field value at the position of the magnetic field sensor without the shielding of the permalloy plates under a same current;

at step 33, performing evaluation on the shielding effect quantitatively and determining key performance parameters: permeability, hysteresis, conductivity, and size, shape and thickness of the plates;

at step 34, by comparative experiments and simulation, verifying the accuracy and reliability of an evaluation result and applying the experiment result to the designing and construction of the magnetically-shielded room;

at step 4, based on the evaluation result, selecting the most appropriate permalloy material and optimizing the structure and parameters of the magnetically-shielded room, so as to complete the testing and evaluation for the permalloy performance.

Furthermore, the quality inspection on the permalloy sample in the step 1 includes:

appearance inspection: inspecting whether the appearance is flat, and whether there is a damage or oxidation on surface;

size inspection: measuring the size of the sample, such as length, width and thickness to ensure compliance with the experimental requirement;

weight inspection: weighing the sample to ensure its weight is reasonable, and removing cavity phenomenon in the sample.

Furthermore, a distance of the magnetic field generation coil and the magnetic field measuring sensor from the permalloy sample in the step 2 is: at ⅓ to ½ of the longest side of the permalloy plate.

Furthermore, before evaluation is performed on the shielding performance of the permalloy sample in the step 3, a magnetized state of a zero-magnetic apparatus material under the magnetic field conditions with different amplitudes is accurately constructed.

Furthermore, the process of constructing the magnetized state of the zero-magnetic apparatus material under the magnetic field conditions with different amplitudes is shown below:

by Jiles-Atherton model, based on an energy balance equation in the material magnetization process, a relationship of a magnetization intensity M, a reversible magnetization intensity $M_{rev}$, an irreversible magnetization intensity $M_{irr}$, and an ideal magnetization intensity $M_{an}$ is obtained, as shown in the formulas (1) to (4):

$$M = M_{rev} + M_{irr} \tag{1}$$

$$M_{rev} = c(M_{an} - M_{irr}) \tag{2}$$

$$M_{an} = M_s\left[\coth\left(\frac{H_e}{\alpha}\right) - \frac{\alpha}{H_e}\right] \tag{3}$$

$$\left(\frac{\mu_0^2 d^2}{2\rho\beta}\frac{dH}{dt}\right)\left(\frac{dM}{dt}\right)^2 + \tag{4}$$

$$\left\{\delta k - \alpha\left[(M_{an} - M) + c\delta k\frac{dM_{an}}{dH_e}\right]\right\} \cdot \frac{dM}{dH} - \left[(M_{an} - M) + c\delta k\frac{dM_{an}}{dH_e}\right] = 0$$

where the magnetization intensity M is composed of the reversible component $M_{rev}$ and the irreversible component $M_{irr}$, and c is a dimensionless parameter, and $0 < c < 1$;

k is an irreversible loss coefficient representing a coupling parameter of the hysteresis characteristic;

$\delta$ is a directional coefficient; when dH/dt>0, $\delta$ is +1 and otherwise $\delta$ is −1 to ensure the defected magnetic domain is energy consumption when magnetized;

$M_s$ is a saturation magnetization intensity; $\alpha$ is an average field parameter reflecting coupling between magnetic domains; a is a density of a magnetic domain wall in a soft magnetic material and has a dimension of magnetic field, and $H_e$ represents an effective magnetic field strength.

Compared with the prior arts, the present disclosure has the following effects.

1. Fast and accurate evaluation method: the traditional performance evaluation method for the magnetically-shielding material is time-consuming and labor-consuming; the method provided in the present disclosure combines the magnetic field measuring technology (in the steps 31 and 32, measuring the size of the magnetic field generated by the coil at the position of the magnetic sensor under the condition of shielding of the permalloy plates or no shielding of the permalloy plates) and magnetic performance of the permalloy to quickly and accurately evaluate the shielding effect of the permalloy in the magnetically-shielded room, saving the evaluation time and cost.

2. Easy operation: the evaluation method of the present disclosure can be operated easily without using complicate equipment and technology and therefore can be applied to laboratories and engineering sites. The researchers and engineers can easily use the method to perform performance evaluation on the magnetically-shielding material, improving the working efficiency.

3. Quantitative evaluation result: by the evaluation method of the present disclosure, the shielding effect of the permalloy under different frequencies and strengths can be quantitatively evaluated and the key performance parameters such as permeability and hysteresis can be determined. This provides scientific basis for selection and optimization of the magnetically-shielding materials.

4. Wide application: the evaluation method of the present disclosure is applicable to the evaluation for various magnetically-shielding materials rather than only to the permalloy. Therefore, this method has wide application prospect and can be applied to the designing and construction of the magnetically-shielded rooms in the fields such as scientific researches, medical diagnosis, and electronic manufacturing and the like.

5. Increased effect of the magnetically-shielded room: by accurately evaluating the performance of the magnetically-shielding material, a more effective magnetically-shielded room structure can be designed to improve the shielding effect against external magnetic fields, thereby satisfying the requirements of different application scenarios for the magnetic shielding.

BRIEF DESCRIPTIONS OF THE DRAWINGS

FIG. 1 is a schematic diagram illustrating a performance testing and evaluation method for a permalloy according to the present disclosure.

DETAILED DESCRIPTIONS OF EMBODIMENTS

The technical solution of the present disclosure is not limited to the following embodiments and can further include any reasonable combination of these specific embodiments.

Specific embodiment 1: this embodiment is described with drawing 1 and includes the following steps.

at step 1, selecting a permalloy sample, and conducting quality inspection on the sample to ensure the sample is compliance with an experiment requirement;

at step 2, setting up an experimental apparatus;

where the permalloy sample is vertically placed, and a magnetic field generation coil and a magnetic field measuring sensor are respectively placed at left and right sides of the permalloy sample;

at step 3, carrying out shielding performance testing and evaluation on the permalloy sample;

at step 31, by adjusting a current of the magnetic field generation coil, generating magnetic fields with different strengths and frequencies, and by using the magnetic field sensor, performing real-time monitoring on a size of the magnetic field shielded by permalloy plates and recording corresponding data;

at step 32, performing Fast Fourier analysis on data collected by the magnetic field sensor to obtain a valid value of the magnetic field corresponding to the applied frequency, namely, the $B_0$ and Bs in the following formula; evaluating the shielding effect of the permalloy under different frequencies and strengths, with the shielding effect calculation formula shown in the Formula (5):

$$SF_B = \frac{|B_0(r)|}{|B_s(r)|} \tag{5}$$

where $B_0$ represents a magnetic field value at the position of the magnetic field sensor with the shielding of the permalloy plates under a same current;

Bs represents a magnetic field value at the position of the magnetic field sensor without the shielding of the permalloy plates under a same current;

at step 33, performing evaluation on the shielding effect quantitatively and determining key performance parameters: permeability, hysteresis, conductivity, and size, shape and thickness of the plates;

at step 34, by comparative experiments and simulation, verifying the accuracy and reliability of an evaluation result and applying the experiment result to the designing and construction of the magnetically-shielded room;

at step 4, based on the evaluation result, selecting the most appropriate permalloy material and optimizing the structure and parameters of the magnetically-shielded room, so as to complete the testing and evaluation for the permalloy performance.

In this embodiment, the magnetic field generation coil is configured to generate magnetic fields with different frequencies and strengths and the magnetic field measuring sensor is configured to perform real-time measurement on the size of the magnetic field shielded by the permalloy sample plates. The information collected by the magnetic field measuring sensor can be transmitted via a data collection unit to a Personal Computer (PC) for data processing.

Theoretically, the shielding effect can be affected by the permeability, hysteresis, conductivity, size, shape and thickness of the permalloy plates. In the step 33 of this embodiment, comparison is mainly performed on the permeability while other parameters are same.

The manner of optimizing the structure and parameters of the magnetically-shielded room in the step 4 includes but not limited to: changing a setup structure of the magnetically-shielded room, for example, using multiple layers of permalloy plates at some connection positions or air gaps; further, using the permalloy of another blending ratio. The two methods are both applicable.

Specific embodiment 2: this embodiment is described with drawing 1. The quality inspection on the permalloy sample in the step 1 in this embodiment includes:

appearance inspection: inspecting whether the appearance is flat, and whether there is a damage or oxidation on surface;

size inspection: measuring the size of the sample, such as length, width and thickness to ensure compliance with the experimental requirement;

weight inspection: weighing the sample to ensure its weight is reasonable, and removing cavity phenomenon in the sample. With this disposal, the experimental requirements can be satisfied. Other compositions and connection relationship are same as in the specific embodiment 1.

Specific embodiment 3: this embodiment is described with drawing 1. A distance of the magnetic field generation coil and the magnetic field measuring sensor from the permalloy sample in the step 2 in this embodiment is: at ⅓ to ½ of the longest side of the permalloy plate. In this case, in order to make the experimental result more obvious, it is required to stay as close to the permalloy plates as possible without contacting. According to actual situations, a proper measurement position can be selected to ensure the truth and effectiveness of the experiment. Other compositions and connection relationship are same as in the specific embodiment 1 or 2.

Specific embodiment 4: this embodiment is described with drawing 1. Before evaluation is performed on the shielding performance of the permalloy sample in the step 3 in this embodiment, a magnetized state of a zero-magnetic apparatus material under the magnetic field conditions with different amplitudes is accurately constructed. The permalloy is a main material for setting up the zero-magnetic apparatus. Other compositions and connection relationship are same as in any of the specific embodiments 1 to 3.

This embodiment achieves the following effects:

High accuracy: by accurately constructing the magnetic field conditions with different amplitudes, it can be guaranteed that the strength and frequency of the magnetic field are in compliance with the experiment design requirements, thereby improving the accuracy and reliability of the experiment.

Strong controllability: based on actual requirements, magnetic field conditions of different amplitudes can be controlled accurately, thereby satisfying the testing and evaluation requirements for shielding performance under different experimental conditions.

Good result comparability: by accurately constructing the magnetic field conditions with different amplitudes, the experimental results with good comparability can be obtained, which is favorable for performing comparison and analysis on the shielding performance under different conditions.

Verification on the effectiveness of the experimental design: the effectiveness of the experimental design can be verified; by measuring the magnetized state of the zero-magnetic apparatus material under different magnetic field conditions, whether the experimental design can accurately reflect the actual situations can be verified.

Reduction on experimental error: by accurately constructing the magnetic field conditions, the experimental error can be reduced, thereby increasing the reliability and repeatability of the experimental result.

Specific embodiment 5: the process of constructing the magnetized state of the zero-magnetic apparatus material under the magnetic field conditions with different amplitudes in this embodiment is shown below:

by Jiles-Atherton model, based on an energy balance equation in the material magnetization process, a relationship of a magnetization intensity M, a reversible magnetization intensity $M_{rev}$, an irreversible magnetization intensity $M_{irr}$, and an ideal magnetization intensity $M_{an}$ is obtained, as shown in the Formulas (1) to (4):

$$M = M_{rev} + M_{irr} \qquad (1)$$

$$M_{rev} = c(M_{an} - M_{irr}) \qquad (2)$$

$$M_{an} = M_s \left[ \coth\left(\frac{H_e}{\alpha}\right) - \frac{\alpha}{H_e} \right] \qquad (3)$$

$$\left(\frac{\mu_0^2 d^2}{2\rho\beta} \frac{dH}{dt}\right)\left(\frac{dM}{dt}\right)^2 + \qquad (4)$$

$$\left\{\delta k - \alpha\left[(M_{an} - M) + c\delta k \frac{dM_{an}}{dH_e}\right]\right\} \cdot \frac{dM}{dH} - \left[(M_{an} - M) + c\delta k \frac{dM_{an}}{dH_e}\right] = 0$$

where the magnetization intensity M is composed of the reversible component $M_{rev}$ and the irreversible component $M_{irr}$, and c is a dimensionless parameter, and $0 < c < 1$;

k is an irreversible loss coefficient representing a coupling parameter of the hysteresis characteristic;

δ is a directional coefficient; when dH/dt>0, δ is +1 and otherwise δ is −1 to ensure the defected magnetic domain is energy consumption when magnetized;

$M_s$ is a saturation magnetization intensity; $\alpha$ is an average field parameter reflecting coupling between magnetic domains; a is a density of a magnetic domain wall in a soft magnetic material and has a dimension of magnetic field, and $H_e$ represents an effective magnetic field strength.

$$\frac{\mu_0^2 d^2}{2\rho\beta}$$

is a common characteristic parameter in an analysis of eddy current loss or magnetic shielding in an electromagnetic field, and H represents a magnetic field strength experienced by the material (unit: A/m) and is the input quantity driving the magnetization process, and is a key field quantity affecting the magnetization behavior of the material; and $\beta$ is a dynamic magnetoviscous damping coefficient, characterizing the damping effect during the dynamic magnetization process, and reflects an energy dissipation characteristics of magnetization as the external field changes and determines the influence of the magnetization rate on the hysteresis width and phase lag.

Quantitative research: by using a calculation result of an electromagnetic model, the frequency and strength parameters of the magnetic field can be determined quantitatively, making the experimental design more scientific and accurate.

Increased experimental repeatability: with the setup of recording experimental parameters such as the frequency and strength of the magnetic field, the experimental result can be more easily repeated and verified, increasing the experimental repeatability and reliability.

Optimized experimental design: based on experimental purposes and research requirements, the experimental conditions with different frequencies and strengths are determined, which helps optimize the experimental design and make the experimental result more explainable and comparable.

Increased experimental efficiency: with the setup of determining the experimental parameters in advance, unnecessary error trials and repeated experiments can be avoided, saving the experimental time and resources and increasing the experimental efficiency.

More guidance of result analysis: the experimental conditions of different frequencies and strengths are recorded, which helps the subsequent result analysis to more accurately evaluate the influence of the magnetic field on the material and provide guidance for further research.

Verification on model accuracy: with the operations of the experimental parameter setup stage, the accuracy and applicability of the electromagnetic model can be verified, which enhances the confidence and trust on the calculation result of the model.

Other compositions and connection relationship are same as in any of the specific embodiments 1 to 4.

In the present disclosure, the shielding effect can be accurately evaluated: in order to ensure normal operation of the devices in the magnetically-shielded room, the present disclosure provides an accurate method, by which accurate measurement can be performed on the shielding effect of the permalloy plates under different frequencies and quantitative evaluation is performed on its performance before the magnetically-shielded room is set up, ensuring the construction and use effect of the magnetically-shielded room measure up to expectations.

Optimized selection of magnetically-shielding material: in the present disclosure, researchers and engineers can conduct in-depth research on the performance characteristics of various magnetically-shielding materials (e.g. permalloy). By this method, the shielding effect of different materials can be more accurately evaluated, and their responses, permeability changes and interaction with external magnetic fields under different frequencies can be known deeply. This helps select the most appropriate material meeting a specific requirement when the magnetically-shielded room is designed and constructed, thereby increasing the performance and efficiency of the magnetically-shielded room. Furthermore, the present disclosure also provides an important experimental tool for researchers to further explore the performance and application potential of the magnetically-shielding material.

Increased performance of the magnetically-shielded room: by accurate evaluation on the performance of the magnetically-shielding material, the shielding characteristics and frequency responses of these materials and their interaction with external magnetic fields can be known deeply, which provides an important basis for designing a more effective magnetically-shielded room structure. By optimizing the structure design, for example, optimizing material configuration and enhancing the boundary control and the like, the shielding effect of the magnetically-shielded room against external magnetic fields can be significantly improved, which enables the magnetically-shielded room to better satisfy the requirements of different application scenarios for the magnetic field shielding in the fields such as scientific research, medical diagnosis or electronic device manufacturing. By accurate evaluation on the magnetically-shielding material, a more efficient and reliable magnetically-shielded room can be designed, thus providing better magnetic field shielding solution for various application scenarios.

The above embodiments are used only to illustrate the technical solution of the present disclosure rather than to limit the present disclosure. Although the present disclosure is described in details by referring to the preceding embodiments, persons of ordinary skills in the prior arts should understand that they can make modification to the technical solution recorded in each of the above embodiments or make equivalent substitution to part of the technical features thereof; such modifications or substitutions do not cause the corresponding technical solution to depart from the spirit and scope of the technical solution of each embodiment of the present disclosure.

What is claimed is:

1. A performance testing and evaluation method for a permalloy material for construction of a magnetically-shielded room, comprising the following steps:

at step 1, selecting a sample of the permalloy material, and conducting quality inspection on the sample to ensure the sample is compliance with an experiment requirement;

appearance inspection: inspecting whether the appearance of the sample is flat, and whether there is a damage or oxidation on surface of the sample;

size inspection: measuring the size of the sample, including length, width and thickness, to ensure compliance with the experimental requirement;

weight inspection: weighing the sample to ensure the weight of the sample is within a limit, and removing cavity phenomenon in the sample;

at step 2, setting up an experimental apparatus;

wherein the sample is placed in a vertical direction, and the sample is located between a magnetic field generation coil and a magnetic field measuring sensor, and the magnetic field generation coil has a circular plane and the circular plane is parallel to the vertical direction;

a distance of the magnetic field generation coil and the magnetic field measuring sensor from the sample is: at ⅓ to ½ of the longest side of the sample, wherein the sample is a permalloy plate;

at step 3, carrying out shielding performance testing and evaluation on the sample;

at step 31, by adjusting a current of the magnetic field generation coil, generating magnetic fields with different strengths and frequencies along a horizontal direction perpendicular to the vertical direction and the circular plane, and by using the magnetic field sensor, performing real-time monitoring on a size of the magnetic field shielded by the permalloy plates and recording corresponding data;

at step 32, performing Fast Fourier analysis on data collected by the magnetic field sensor to obtain a valid value of the magnetic field corresponding to the applied frequency, namely, the $B_0$ and Bs in the following formula; evaluating the shielding effect of the permalloy plate under different frequencies and strengths, with the shielding effect calculation formula shown in the Formula (5):

$$SF_B = \frac{|B_0(r)|}{|B_s(r)|} \tag{5}$$

wherein $B_0$ represents a magnetic field value at the position of the magnetic field sensor with the shielding of the permalloy plates under a same current;

Bs represents a magnetic field value at the position of the magnetic field sensor without the shielding of the permalloy plate under a same current;

at step 33, performing evaluation on the shielding effect quantitatively and determining key performance parameters: permeability, hysteresis, conductivity, and size, shape and thickness of the plates;

at step 34, by comparative experiments and simulation, verifying the accuracy and reliability of an evaluation result, and applying the experiment result to the designing and construction of the magnetically-shielded room; and at step 4, based on the evaluation result, selecting the permalloy material with an optimized evaluation result and utilizing the optimized evaluation result to optimize the structure and parameters of the magnetically-shielded room, so as to complete the testing and evaluation for performance of the permalloy material;

before testing and evaluation is performed on the shielding performance of the permalloy sample in the step 3, a magnetized state of a zero-magnetic apparatus material under the magnetic field conditions with different amplitudes is accurately constructed;

wherein the process of constructing the magnetized state of the zero-magnetic apparatus material under the magnetic field conditions with different amplitudes is shown below:

by Jiles-Atherton model, based on an energy balance equation in material magnetization process, a relationship of a magnetization intensity M, a reversible magnetization intensity $M_{rev}$, an irreversible magnetization intensity $M_{irr}$, and an ideal magnetization intensity $M_{an}$ is obtained, as shown in the formulas (1) to (4):

$$M = M_{rev} + M_{irr} \tag{1}$$

$$M_{rev} = c(M_{an} - M_{irr}) \tag{2}$$

$$M_{an} = M_s\left[\coth\left(\frac{H_e}{\alpha}\right) - \frac{\alpha}{H_e}\right] \tag{3}$$

$$\left(\frac{\mu_0^2 d^2}{2\rho\beta}\frac{dH}{dt}\right)\left(\frac{dM}{dt}\right)^2 + \tag{4}$$

$$\left\{\delta k - \alpha\left[(M_{an} - M) + c\delta k\frac{dM_{an}}{dH_e}\right]\right\} \cdot \frac{dM}{dH} - \left[(M_{an} - M) + c\delta k\frac{dM_{an}}{dH_e}\right] = 0$$

wherein the magnetization intensity M is composed of the reversible component $M_{rev}$ and the irreversible component $M_{irr}$, and C is a dimensionless parameter, and $0<c<1$;

k is an irreversible loss coefficient representing a coupling parameter of the hysteresis characteristic;

$\delta$ is a directional coefficient; when dH/dt>0, $\delta$ is +1 and otherwise $\delta$ is −1 to ensure the defected magnetic domain is energy consumption when magnetized;

$M_s$ is a saturation magnetization intensity; $\alpha$ is an average field parameter reflecting coupling between magnetic domains; a is a density of a magnetic domain wall in a soft magnetic material and has a dimension of magnetic field, and $H_e$ represents an effective magnetic field strength;

$$\frac{\mu_0^2 d^2}{2\rho\beta}$$

is a common characteristic parameter in an analysis of eddy current loss or magnetic shielding in an electromagnetic field, and H represents a magnetic field strength experienced by the material (unit: A/m) and is the input quantity driving the magnetization process, and is a key field quantity affecting the magnetization behavior of the material; and $\beta$ is a dynamic magnetoviscous damping coefficient, characterizing the damping effect during the dynamic magnetization process, and reflects an energy dissipation characteristics of magnetization as the external field changes and determines the influence of the magnetization rate on the hysteresis width and phase lag.

\* \* \* \* \*